(12) United States Patent
Rueger et al.

(10) Patent No.: US 7,557,047 B2
(45) Date of Patent: Jul. 7, 2009

(54) METHOD OF FORMING A LAYER OF MATERIAL USING AN ATOMIC LAYER DEPOSITION PROCESS

(75) Inventors: Neal Rueger, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 197 days.

(21) Appl. No.: 11/423,197

(22) Filed: Jun. 9, 2006

(65) Prior Publication Data

US 2007/0287300 A1    Dec. 13, 2007

(51) Int. Cl.
   *H01L 21/31* (2006.01)
(52) U.S. Cl. .............. 438/763; 438/685; 438/686; 438/758; 438/761; 438/778; 438/785
(58) Field of Classification Search .......... 438/685, 438/686, 758, 761, 763, 778, 785
   See application file for complete search history.

(56) References Cited

U.S. PATENT DOCUMENTS

| | | | |
|---|---|---|---|
| 6,753,271 B2* | 6/2004 | Sarigiannis et al. | 438/785 |
| 6,824,816 B2* | 11/2004 | Aaltonen et al. | 427/124 |
| 2005/0012975 A1* | 1/2005 | George et al. | 359/223 |
| 2005/0020060 A1* | 1/2005 | Aaltonen et al. | 438/650 |
| 2005/0032342 A1* | 2/2005 | Forbes et al. | 438/587 |
| 2005/0054165 A1* | 3/2005 | Ahn et al. | 438/287 |
| 2005/0179097 A1* | 8/2005 | Forbes et al. | 257/407 |
| 2005/0221021 A1 | 10/2005 | Strang | |
| 2006/0030148 A1* | 2/2006 | Seutter et al. | 438/653 |
| 2006/0128150 A1* | 6/2006 | Gandikota et al. | 438/681 |

OTHER PUBLICATIONS

Rueger, Neal R. et al., PCT/US2007/069091, Filed May 17, 2007, Aug. 20, 2008 PCT International Search Report and Written Opinion.
Parks et al., "Plasma-Enhanced Atomic Layer Deposition of Tantalum Nitrides Using Hydrogen Radicals as a Reducing Agent" Electrochemical and Solid-State Letters, IEEE Service Center, Piscataway, NJ, US, vol. 4, No. 4, Apr. 1, 2001, pp. C17-C19.
Rueger, Neal R. et al., PCT/US2007/069091, filed May 17, 2007, Dec. 24, 2008 International Preliminary Report on Patentability.

* cited by examiner

*Primary Examiner*—Kevin M Picardat
*Assistant Examiner*—Bac H Au
(74) *Attorney, Agent, or Firm*—Wells St. John P.S.

(57) ABSTRACT

Disclosed is a method of forming a layer of material using an atomic layer deposition (ALD) process in a process chamber of a process tool. In one illustrative embodiment, the method includes identifying a target characteristic for the layer of material, determining a precursor pulse time for introducing a precursor gas into the process chamber during the ALD process to produce the target characteristic in the layer of material, and performing the ALD process that comprises a plurality of steps wherein the precursor gas is introduced into the chamber for the determined precursor pulse time to thereby form the layer of material.

11 Claims, 7 Drawing Sheets

METHOD OF FORMING A LAYER OF MATERIAL USING AN ATOMIC LAYER DEPOSITION PROCESS

BACKGROUND OF THE INVENTION

1. Field of the Invention

The present invention generally relates to the formation of a layer of material, and, more particularly, to a method of forming a layer of material using an atomic layer deposition process.

2. Description of the Related Art

Manufacturing integrated circuit devices involves performing numerous steps and processes until the integrated circuit device is complete. For example, such processes typically include a variety of deposition processes, etching processes, photolithography processes, and ion implantation processes. As the size of integrated circuit devices continues to shrink, the performance of such operations becomes even more complex given the very small feature sizes involved and the required performance characteristics of the complete device.

Layers of material may be deposited using a variety of different deposition processes. One such process is known as atomic layer deposition (ALD). The ALD process may be enhanced by the generation of a plasma. In general, ALD processes are employed where it is desired to form very thin, high quality layers of material. Basically, the ALD process is a technique that deposits layers or films one atomic layer at a time. In an ALD process, reactants are introduced one at a time with pump/purge cycles in between. ALD reactions involve self-saturating surface reactions. Due to the nature of the ALD process, it is inherently slower than other known deposition techniques, such as chemical vapor deposition (CVD), low pressure chemical vapor deposition (LPCVD), etc. However, the ALD process does tend to produce layers of material with higher quality characteristics as compared to the other illustrative deposition processes mentioned above.

Various properties of layers of material formed by an ALD process are important in the manufacture of modern integrated circuit devices. Moreover, precise control of the thickness of such layers is also an important aspect of forming layers of material by ALD processes. Unfortunately, existing ALD processing techniques do not adequately address some or all of these issues.

The present invention is directed to methods that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a method of forming a layer of material using an atomic layer deposition (ALD) process in a process chamber of a process tool. In one illustrative embodiment, the method comprises identifying a target characteristic for the layer of material, determining a precursor pulse time for introducing a precursor gas into the process chamber during the ALD process to produce the target characteristic in the layer of material, and performing the ALD process that comprises a plurality of steps wherein the precursor gas is introduced into the chamber for the determined precursor pulse time to thereby form the layer of material.

In another illustrative embodiment, the method comprises identifying a target characteristic for the layer of material, determining a precursor pulse time for introducing a precursor gas into the process chamber during the ALD process to produce the target characteristic in the layer of material, and performing an ALD process comprised of a plurality of pulsing patterns to form the layer of material, each of the pulsing patterns comprising evacuating the chamber during a first time period, introducing the precursor gas into the chamber during a second time period that corresponds to the determined precursor pulse time and evacuating the chamber during a third time period.

In yet another illustrative embodiment, the method comprises positioning a substrate within the process chamber, establishing a ligand removal environment in the chamber and performing an ALD process comprised of a plurality of first pulsing patterns and a plurality of second pulsing patterns to form a layer of material above the substrate, each of the first and second pulsing patterns comprising evacuating the chamber during a first time period, introducing a precursor gas into the chamber during a second time period and evacuating the chamber during a third time period, wherein the second time period during the first plurality of pulsing patterns is different from the second time period during the second plurality of pulsing patterns.

In a further illustrative embodiment, the method comprises identifying a target variation for the characteristic for the layer of material, determining a first precursor pulse time and a second precursor pulse time for introducing a precursor gas into the process chamber during the ALD process to produce the target variation of the characteristic in the layer of material, the first and second precursor pulse times being different from one another, and performing an ALD process comprised of a plurality of first pulsing patterns and a plurality of second pulsing patterns to form the layer of material, wherein each of the first and second pulsing patterns comprises introducing the precursor gas into the chamber in accordance with the first and second determined precursor pulse times, respectively, to thereby form the layer of material.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various regions and structures of an integrated circuit device are depicted in the drawings. For purposes of clarity and explanation, the relative sizes of the various features depicted in the drawings may be exaggerated or reduced as compared to the size of those features or structures on real-world integrated circuit devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be explicitly set forth in the specification in a definitional manner that directly and unequivocally provides the special definition for the term or phrase.

The present invention is directed to a novel method of forming layers of material by performing an ALD process wherein certain properties of the resulting layer of material may be controlled. It is believed that the present invention may be employed in forming a variety of different materials using the ALD process described herein. Moreover, it is believed that the process described herein may be performed using a variety of different ALD process tools. In one illustrative embodiment, as will be described more fully below, a layer of ruthenium was formed by performing a plasma ALD process in an ASM Polygon Emerald chamber tool using the methodologies disclosed herein.

Figure 1:
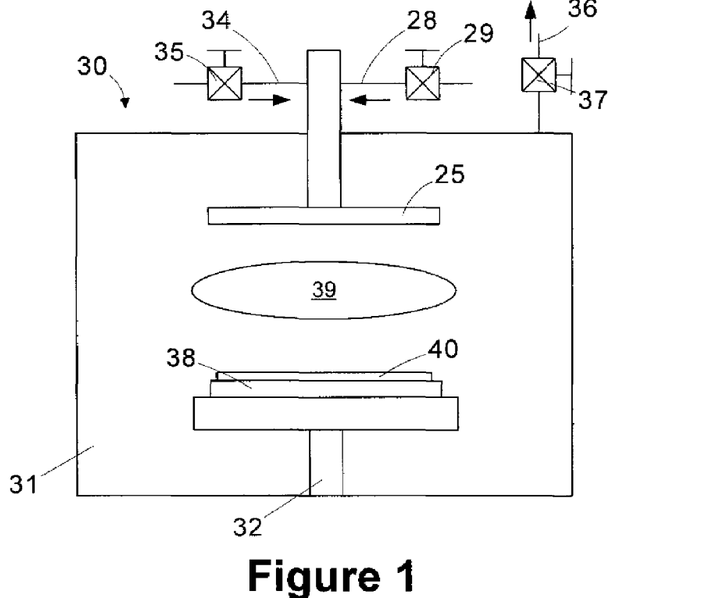
FIG. 1 is a simplified schematic view of an illustrative atomic layer deposition (ALD) tool.

In general, the present invention involves performing an ALD process comprised of a unique pulsing sequence of precursor gases and, in some cases, RF power to form a layer of material. FIG. 1 is a schematic depiction of an illustrative ALD process tool 30. The illustrative tool 30 comprises a process chamber 31, a stage 32, a showerhead 25, a gas inlet 28 (that may be controlled by a valve 29), a precursor gas inlet 34 (that may be controlled by a valve 35), and an outlet 36 (that may be controlled by a valve 37). In some cases, the tool 30 may comprise RF coils (not shown), although such coils are not required on all ALD tools 30. An illustrative substrate 38 is depicted as being positioned on the stage 32. The basic structure and operation of such an ALD process tool 30 is well known to those skilled in the art. As will be recognized by those skilled in the art after a complete reading of the present application, the present invention may be employed with a variety of different ALD process tools. Thus, the present invention should not be considered as limited to use with ALD tools that are similar to the one schematically depicted in FIG. 1.

During operation, an ALD process is performed to form a layer of material 40 on the substrate 38. The present invention may be employed with a plasma enhanced ALD process or a thermal ALD process. Precursor gases may be introduced into the chamber 31 via the inlet 36. A carrier gas may be employed to carry the precursor gas to the chamber 31. In one illustrative embodiment, the carrier gas is an inert gas, such as argon, helium, etc. In one particular application, the carrier gas may be bubbled through a container of liquid precursor, whereby the carrier gas picks up and retains portions of the precursor which are introduced into the chamber 31.

Various gases may be introduced into the chamber 31 via the inlet 28 to establish the appropriate environment. In general, the environment within the chamber 31 should be such that it promotes or enables ligand removal during the ALD process. The particular gas employed will vary depending upon the particular application. For example, gases such as ammonia ($NH_3$), hydrogen ($H_2$), nitrogen ($N_2$) and oxygen ($O_2$), or combinations thereof, may be employed. Moreover, in some embodiments, RF power may be supplied to the showerhead 25 to create the plasma within the chamber 31. A voltage may be established on the showerhead 25 during the ALD process. The stage 32 may or may not be biased depending upon the particular application and the particular process tool.

The present invention may be employed to form layers of a variety of different materials. For example, it is believed that the present invention may be employed in forming materials such as ruthenium, tantalum, silicon dioxide, tantalum nitride, ruthenium oxide, platinum, etc. Thus, the present invention, in its broadest form, should not be considered as limited to any particular type of material. Of course, the particular process gases and operating parameters will vary depending upon the particular material being formed.

Figure 2:
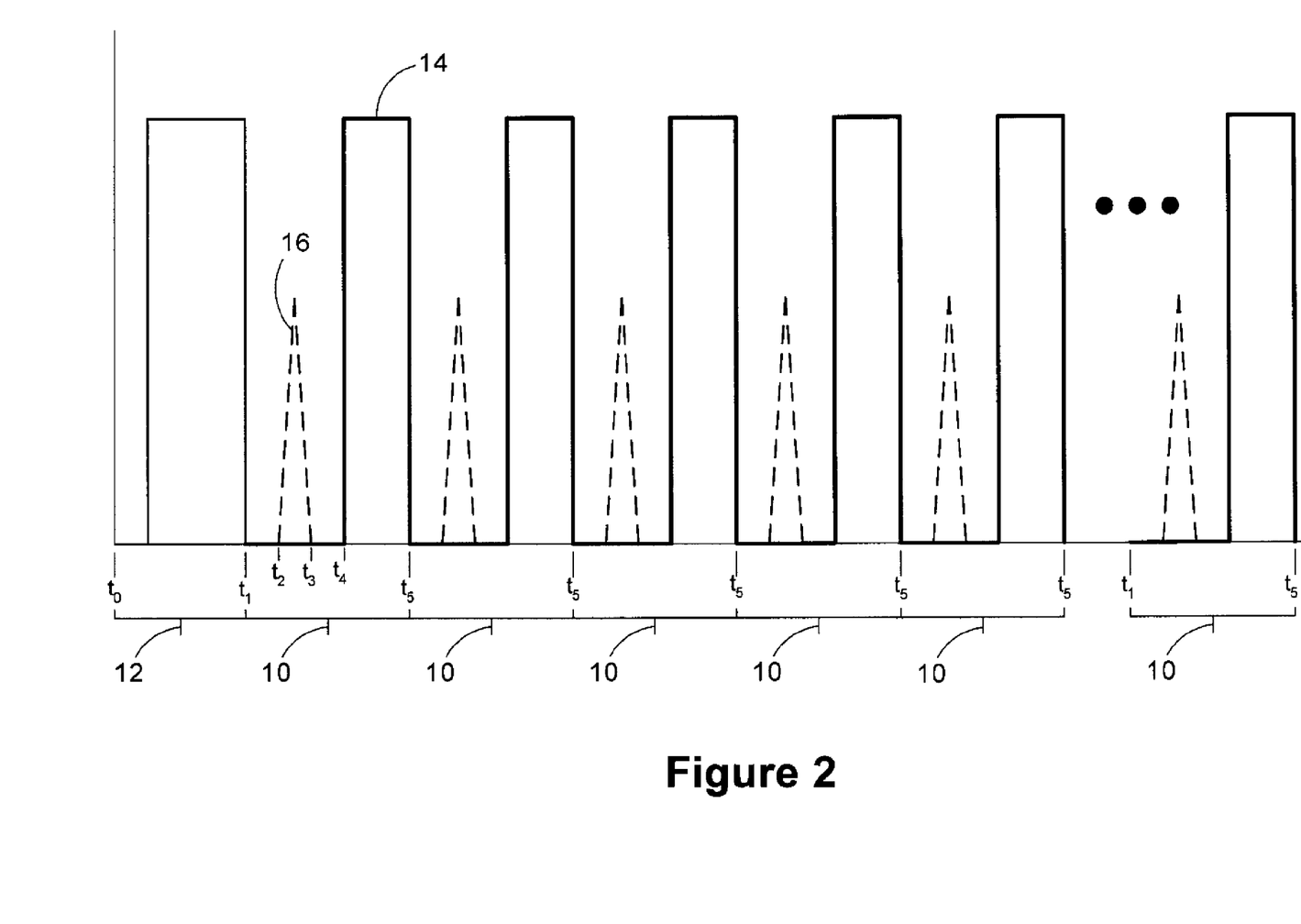
FIG. 2 is a graph depicting an illustrative pulsing sequence in accordance with one aspect of the present invention that may be employed in an ALD process to form a layer of material.

As shown in FIG. 2, the methods disclosed herein involve performing a unique series of pulse patterns 10 that may be repeated hundreds or thousands of times to form the desired layer of material 40. The time period 12 ($t_0 \rightarrow t_i$) constitutes a chamber initialization period and may or may not be performed prior to performing the methods disclosed herein. Each pulse pattern 10 extends from time period $t_1$ through time period $t_5$. A plurality of times ($t_2$, $t_3$ and $t_4$) that occur within each pulse pattern 10 are also depicted. In one illustrative embodiment, RF power may be applied to create a plasma 39 within the chamber 31. In FIG. 2, the RF power applied to the showerhead 25 is indicated by the line 14. The introduction of precursor gas is indicated by the line 16. The duration of the introduction of the precursor gas will be referenced to herein as the precursor pulse time ("PPT").

Figure 3:
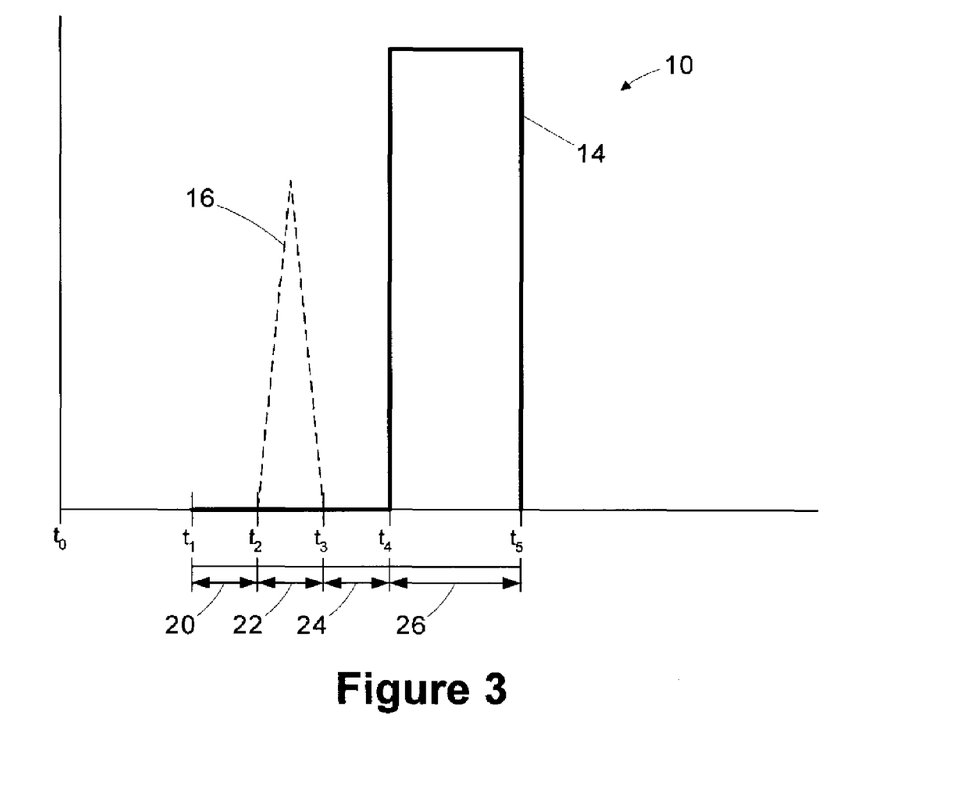
FIG. 3 is a graph depicting an enlarged view of a single pulse pattern depicted in FIG. 2.

FIG. 3 is an enlarged view of an exemplary single pulse pattern 10. In this particular embodiment, each pulse pattern 10 comprises a first time period 20 ($t_1 \rightarrow t_2$), a second time period 22 ($t_2 \rightarrow t_3$), a third time period 24 ($t_3 \rightarrow t_4$) and a fourth time period 26 ($t_4 \rightarrow t_5$). In one illustrative embodiment, the appropriate environment is established within the chamber 31 by introducing the desired gas through the line 28. Thereafter, during the first time period 20, the chamber 31 is evacuated via line 36. During the second time period 22, precursor gas is introduced into the chamber 31 via line 34. The precursor gas may be introduced into the chamber 31 by opening and closing the valve 35 for a brief period of time. During the third time period 24, the chamber 31 is again evacuated via line 36. During the second evacuation process, portions of the precursor gas that are not adsorbed on the surface of the substrate 38 are removed. Thereafter, during the fourth time period 26, power is applied to the showerhead 25 to thereby generate the plasma 39 within the chamber 31. In some tools, where RF coils are present, e.g., inductively coupled plasma tools, the RF power may be supplied by such coils.

The chemistry of the plasma environment within the chamber 31 is selected such that it promotes or enables the removal of ligands. More specifically, the environment should react with the adsorbed precursor gases and leave behind a portion of those adsorbed gases to thereby form the layer of material 40. The plasma environment is also selected so as to insure that the surface of the deposited material is ready to accept additional material that will be formed. Of course, in some applications, e.g., thermal ALD processes, the fourth time period 26 may not be present in the pulse pattern 10. In thermal ALD processes, no plasma 39 is generated. Thus, there is no need to apply RF power to the showerhead 25.

The duration of the first, second, third and fourth time periods may vary depending on the particular application. In general, it is believed that each of the first, second and third time period may range from 1-4 seconds and that the fourth time period may range from 3-12 seconds, depending on the particular application. Of course, these representative numbers may vary significantly depending upon, among other things, the nature of the structure on which the layer is being deposited, as is well known to those skilled in the art, e.g., all other things being equal, shallower trenches require shorter pulse times as compared to deeper trenches to achieve full step coverage. Each of the various time periods identified above may be independently adjusted. Note that, in the illustrative embodiment depicted in FIG. 2, the RF power is off during the first, second and third time periods. However, that may not be the case in all embodiments of the present invention.

Figure 4:
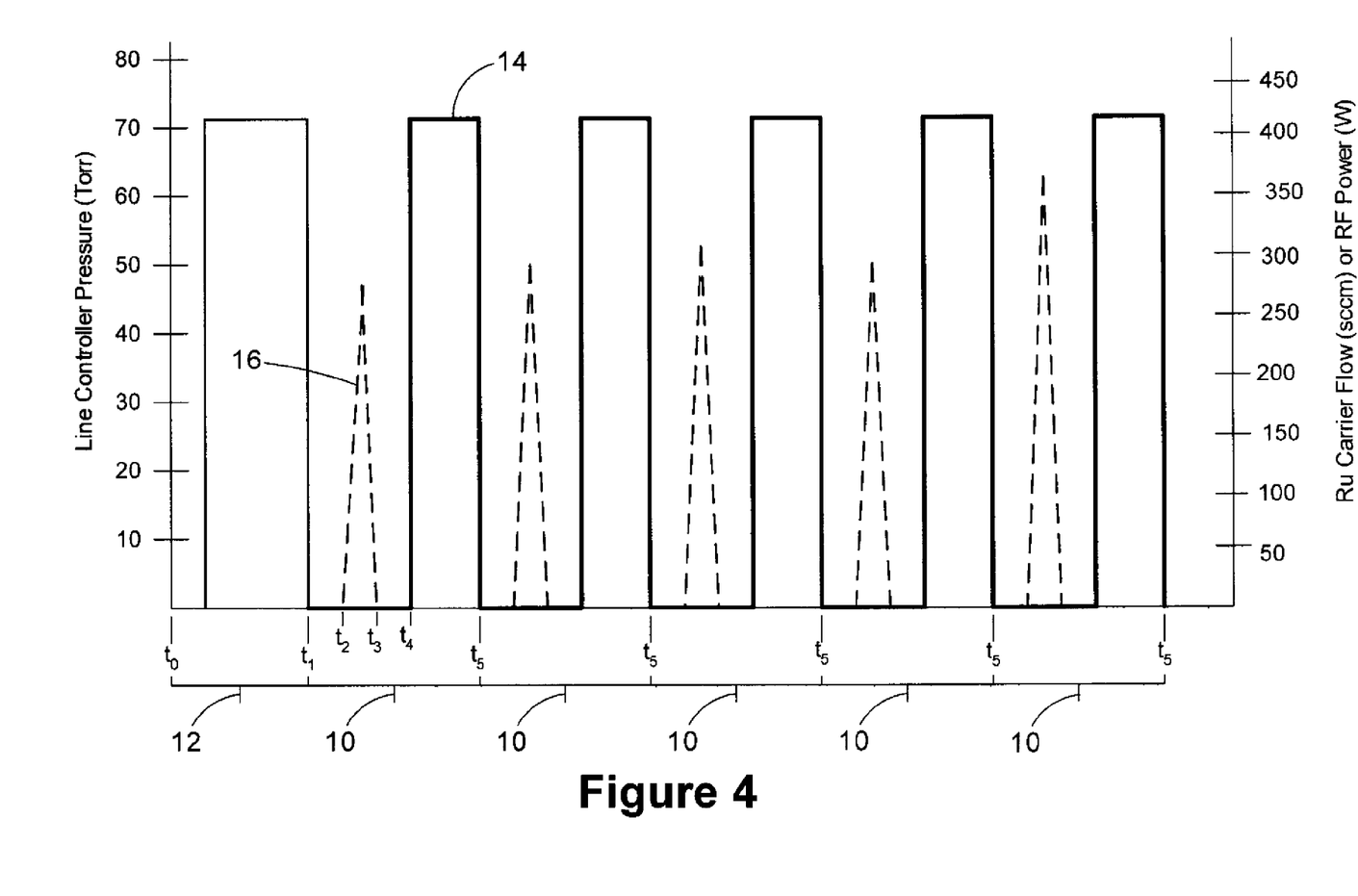
FIG. 4 is a graph depicting an illustrative pulsing sequence in accordance with one illustrative embodiment of the present invention that may be employed in an ALD process to form a layer of ruthenium.

FIG. 4 depicts a sequence of pulse patterns 10 for a particular application of the present invention wherein a layer of ruthenium is deposited. In this illustrative example, the ruthenium precursor gas is (bis)ethylcyclopentadienyl)Ruthenium, an ammonia ($NH_3$) environment is established within the chamber 31 and a plasma 39 is generated during the process. In this particular example, the duration of the first 20, second 22 and third 24 time periods are approximately two seconds each. The fourth time period 26 is approximately four seconds. In this particular embodiment, an AC power of approximately 400 watts was applied to the showerhead 25 and the stage 32 was not biased.

Figure 5:
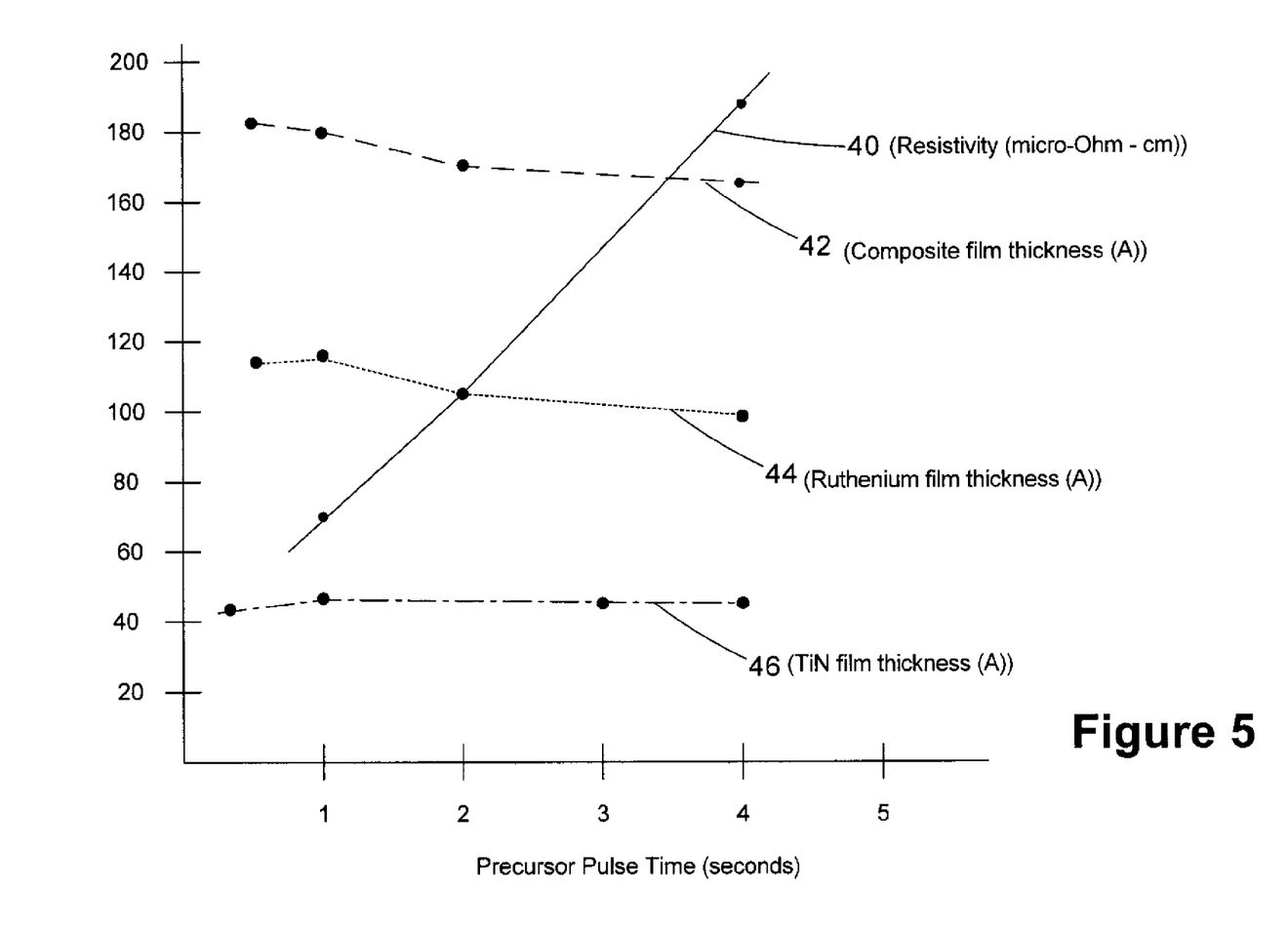
FIG. 5 is a graph depicting various illustrative properties of a ruthenium film formed in accordance with the inventive method disclosed herein.

FIG. 5 is a graph depicting various parameters of a layer of ruthenium formed using the present techniques on a layer of titanium having a thickness of approximately 40 Å. Various parameters are plotted on the graph shown in FIG. 5—resistivity 40 (micro-Ohm/cm), composite film thickness 42 (Å), the thickness of the ruthenium layer 44 (Å), and the thickness of the titanium nitride (TiN) underlying layer 46 (Å). The horizontal axis reflects increasing precursor pulse times in seconds. From FIG. 5 it is apparent that as precursor pulse time is increased, the resistivity of the composite layer stack (titanium plus ruthenium increases, while the thickness of the ruthenium film (44) shows a slight decrease in thickness. For example, at a precursor pulse time of approximately one second, a ruthenium layer (44) having a thickness of about 115 Å is formed. At a precursor pulse time of approximately four seconds, the thickness of the ruthenium layer is about 100 Å. However, the resistivity of these two ruthenium layers varies quite dramatically, and unexpectedly, from about 70 to 185, respectively, for precursor pulse times of about 1 and 4 seconds.

Figure 6:
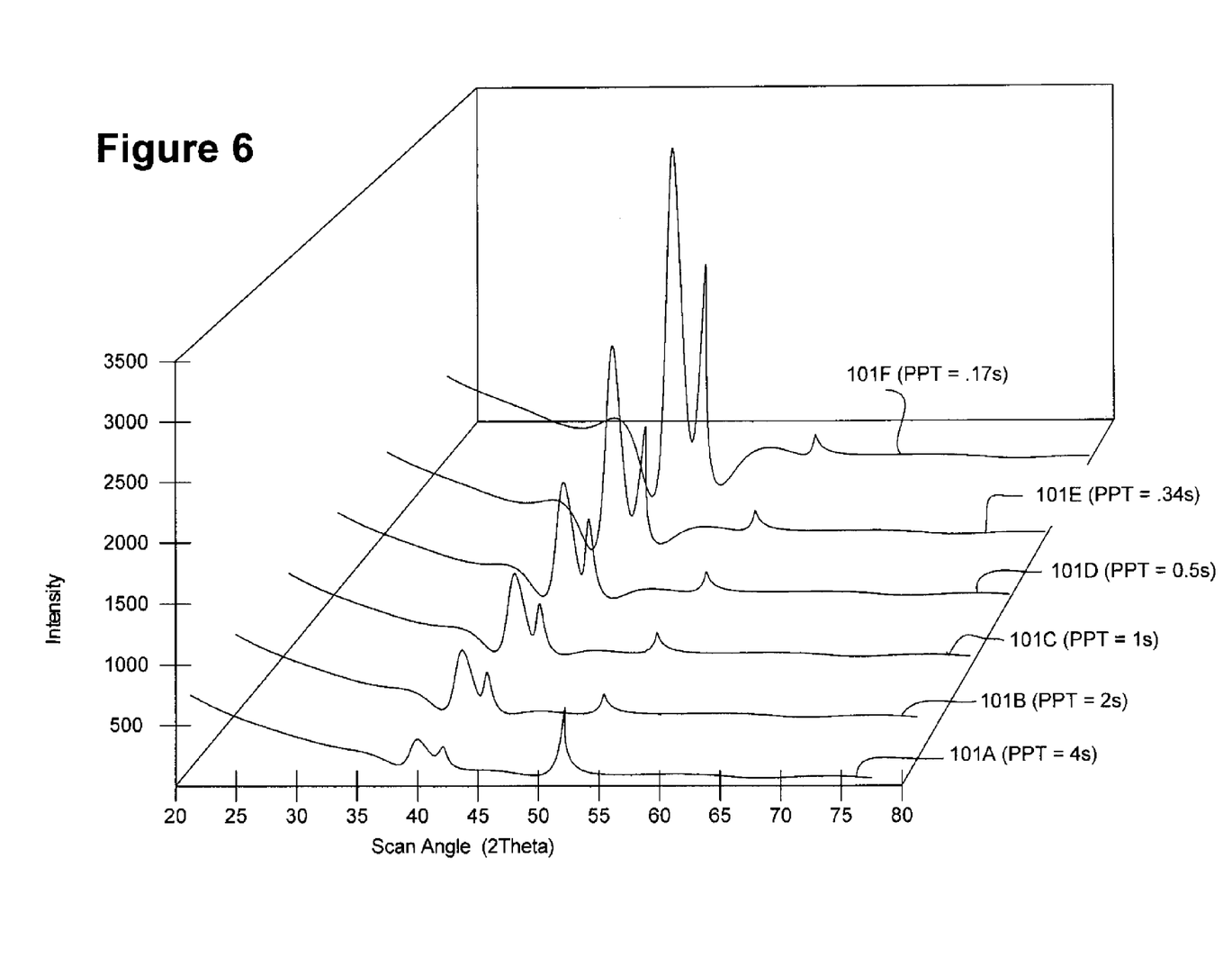
FIG. 6 is a graph depicting an x-ray diffraction analysis representative of the crystallinity of a layer of material formed using various precursor pulse times.

The present invention may also be employed to control the crystallinity of a layer of material formed using the ALD process described herein. FIG. 6 is a three-dimensional plot of data obtained by x-ray diffraction analysis of a layer of ruthenium formed above an underlying 40 Å layer of titanium nitride. The plots 101A, 101B, 101C, 101D, 101E, and 101F represent layers formed using precursor pulse times ("PPT") of 4, 2, 1, 0.5, 0.34 and 0.17 seconds, respectively. The horizontal axis is the scan angle employed during the x-ray diffraction process. The vertical axis is the intensity which reflects the crystallinity of the ruthenium layer. In general, the shorter the precursor pulse time, the greater the crystallinity of the layer.

Figure 7:
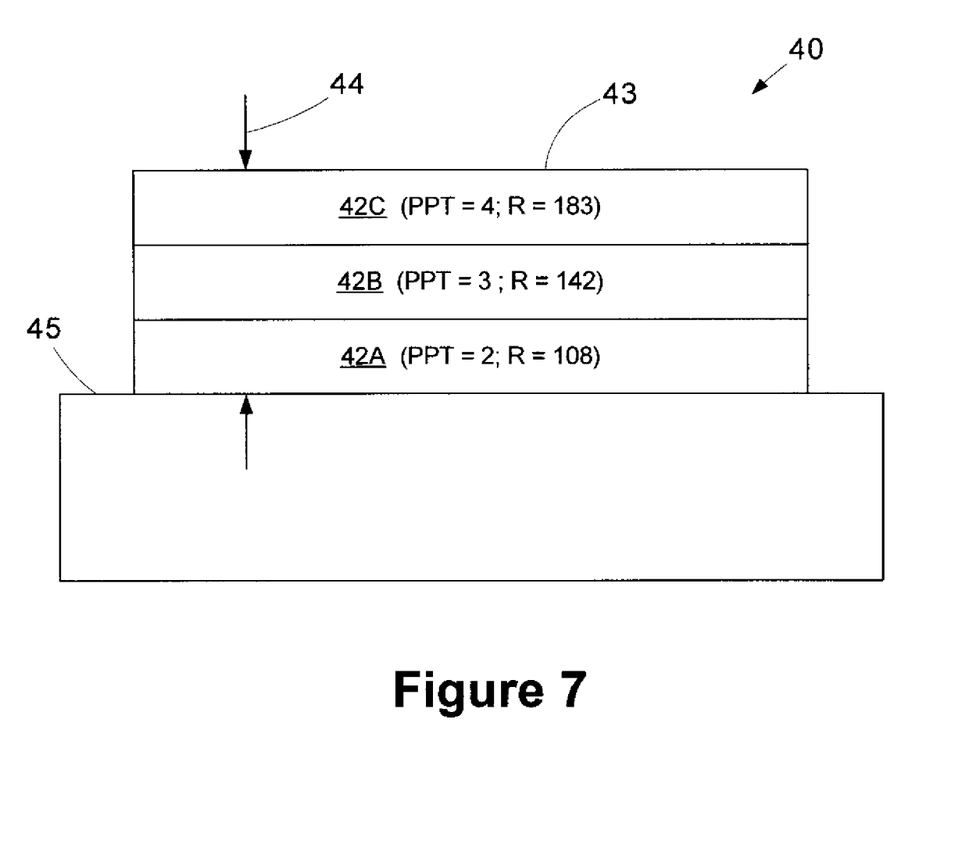
FIG. 7 is a cross-sectional view of a layer of material formed in accordance with one aspect of the present invention wherein the layer has variable characteristics throughout its thickness.

The present invention may be employed to form layers of material 40 having substantially uniform properties throughout the thickness of the layer of material 40. The present invention may also be used to produce layers of material 40 having differing characteristics throughout its thickness. Such varying characteristics may be achieved by varying the precursor pulse time (PPT) as the layer is being formed. FIG. 7 depicts an illustrative embodiment of a layer of material 40 formed in accordance with this aspect of the invention wherein the characteristics of the layer of material vary throughout the thickness 44 of the layer of material 40. The thickness 44 of the layer of material 40 is greatly exaggerated for purposes of explanation. In FIG. 7, the layer of material 40 is depicted as being formed above an illustrative substrate or structure 38. In some cases, the structure 38 may be another process layer that is formed above a surface of a semiconducting substrate.

As indicated in FIG. 7, the layer 40 comprises a first portion 42A, a second portion 42B and a third portion 42C which are formed using precursor pulse times (PPT) of 2, 3 and 4 seconds, respectively. Due to the increased precursor pulse time, the third portion 42C has a higher resistivity as compared to the other two portions 42B, 42A, as indicated in FIG. 7. Conversely, the first portion 42A has a lower resistivity than either the second or third portions 42B, 42C. Such a layer 40 may be required where a high degree of resistivity (and low crystallinity) is desirable or can be tolerated at the upper surface 43 of the layer 40 than at the interface between the layer 40 and the surface 45 of the structure 38.

Figure 8:
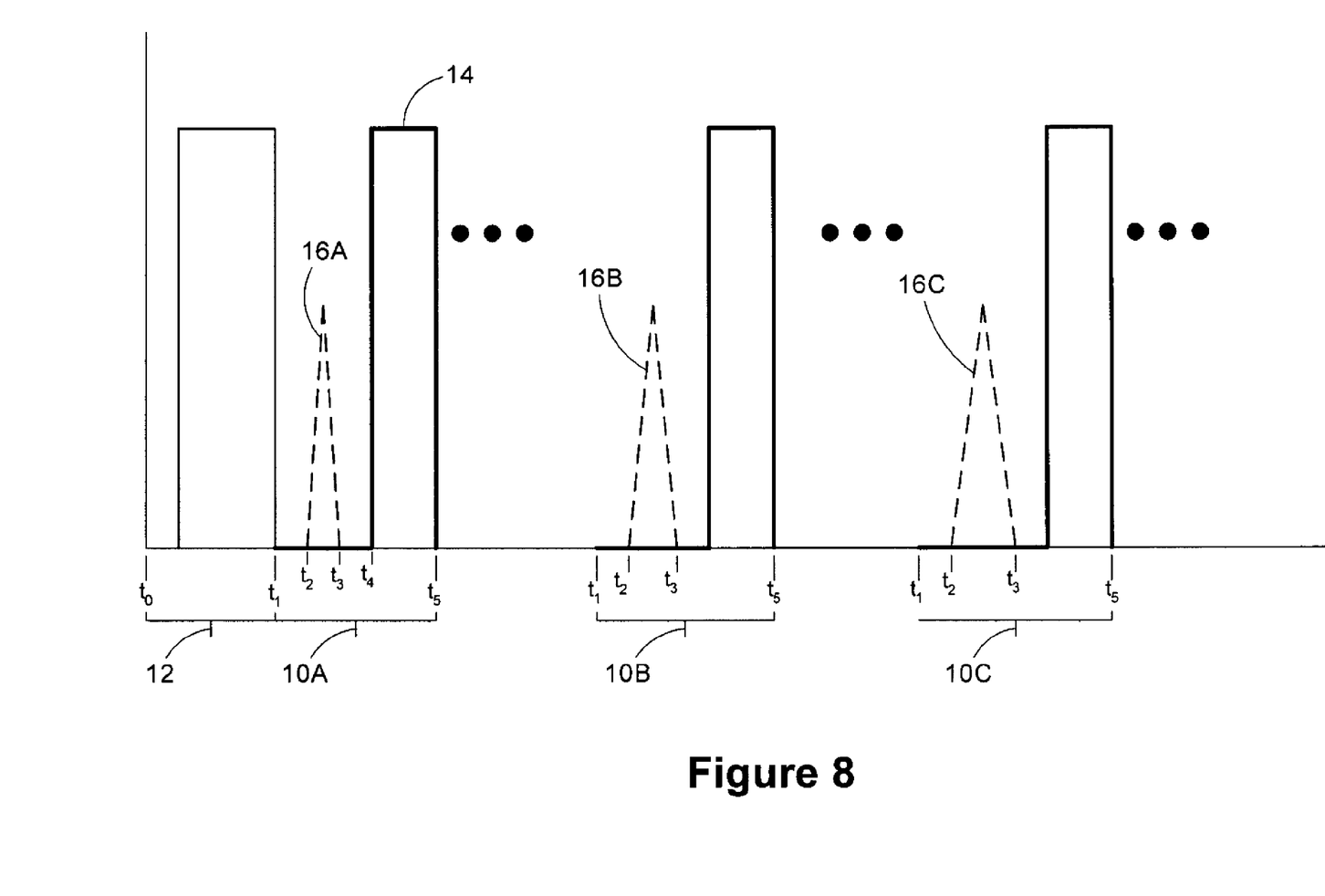
FIG. 8 is a graph depicting an illustrative pulsing sequence in accordance with one aspect of the present invention that may be employed in an ALD process to form the layer depicted in FIG. 7.

FIG. 8 depicts an illustrative pulsing sequence that may be employed to form the multi-layer structure depicted in FIG. 7. FIG. 8 shows three illustrative pulse patterns 10A, 10B and 10C in which the precursor pulse time is, respectively, 2, 3 and 4 seconds. Of course, there will be hundreds or thousands of each of said pulses during an ALD process that is performed to form the layer 40 shown in FIG. 7. It should also be understood that, with the teachings of the present application, the pulsing sequences can be arranged in virtually any manner in an effort to provide a layer 40 having the desired characteristics or qualities.

As will be recognized by those skilled in the art after a complete reading of the present application, the methodologies disclosed herein enable layers of material formed by an ALD process to have certain desired characteristics that may be engineered to meet particular applications.

In accordance with this aspect of the present invention, a desired or target characteristic, e.g., resistivity, crystallinity, of the layer of material 40 may be initially determined. Thereafter, the precursor pulse time that will produce this desired characteristic may be determined. For example, if a layer of material 40 with a relatively high resistivity is desired, then the precursor pulse time that will produce a layer of material 40 having such a level of resistivity is determined or identified. Thereafter, an ALD process is performed using the determined precursor pulse time to thereby form the layer 40 having the desired characteristics. This may be applied to produce a layer of material 40 having a substantially uniform characteristic throughout its thickness or with a layer of material 40 in which the characteristics vary within its thickness, such as in the example depicted in FIG. 7.

The novel methodologies disclosed produced very unexpected results as it relates to the formation of the layer of ruthenium discussed previously. As will be understood by those skilled in the art, traditional ALD processes typically reach a point of saturation. That is, in a traditional ALD process, as the precursor pulse time increases, the deposition rate of the process tends to flatten out, i.e., it is a self-limiting process. Moreover, traditional ALD processes do not involve varying the precursor pulse time to achieve desired film characteristics, such as resistivity, crystallinity, etc. Pursuant to the novel methodologies disclosed herein, the precursor pulse times may be controlled so as to control the characteristics of the resulting layer of material. Additionally, in the present invention, the thickness of the layer of ruthenium unexpectedly decreased as the precursor pulse time increased.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a layer of material by performing an atomic layer deposition (ALD) process in a process chamber of a process tool, the method comprising:
   positioning a substrate within said process chamber;
   establishing a ligand removal environment in said chamber; and
   performing an ALD process comprised of a plurality of first pulsing patterns to form a first portion of a layer of material above said substrate and a plurality of second pulsing patterns to form a second portion of the layer of material above said substrate, each of said first and second pulsing patterns comprising:
   evacuating said chamber during a first time period;
   introducing a precursor gas into said chamber during a second time period; and
   evacuating said chamber during a third time period;
   wherein said second time period during said first plurality of pulsing patterns is different from said second time period during said second plurality of pulsing patterns, and wherein the first portion of the layer and the second portion of the layer differ in at least characteristic selected from the group consisting of degree of crystallinity and resistivity.

2. The method of claim 1, wherein establishing a ligand removal environment in said chamber comprises introducing at least one of ammonia ($NH_3$), hydrogen ($H_2$), nitrogen ($N_2$) and oxygen ($O_2$) into said process chamber to establish said ligand removal environment.

3. The method of claim 1, further comprising generating a plasma within said chamber by applying RF power to said chamber.

4. The method of claim 1, wherein, during said first, second and third time periods, RF power is not applied to said process chamber.

5. The method of claim 1, wherein said first and third time periods have approximately the same duration.

6. A method of forming a layer of material having a characteristic that varies within its thickness by performing an atomic layer deposition (ALD) process in a process chamber of a process tool, the method comprising:
   identifying a target variation for said characteristic for said layer of material, the target characteristic being selected from the group consisting of crystallinity and resistivity;
   determining a first precursor pulse time and a second precursor pulse time for introducing a precursor gas into said process chamber during said ALD process to produce said target variation of said characteristic in said layer of material, said first and second precursor pulse times being different from one another; and
   performing an ALD process comprised of a plurality of first pulsing patterns and a plurality of second pulsing patterns to form said layer of material, wherein each of said first and second pulsing patterns comprises introducing said precursor gas into said chamber in accordance with said first and second determined precursor pulse times, respectively, to thereby form said layer of material.

7. The method of claim 6, wherein said target characteristic is a resistivity of said layer of material.

8. The method of claim 6, wherein said target characteristic is a crystallinity of said layer of material.

9. The method of claim 6, further comprising establishing a ligand removal environment within said chamber.

10. The method of claim 9, wherein establishing a ligand removal environment in said chamber comprises introducing at least one of ammonia ($NH_3$), hydrogen ($H_2$), nitrogen ($N_2$) and oxygen ($O_2$) into said process chamber to establish said ligand removal environment.

11. The method of claim 6, further comprising generating a plasma within said chamber by applying RF power to said chamber.

* * * * *